United States Patent

Fang et al.

Patent Number: 6,128,211
Date of Patent: Oct. 3, 2000

[54] STRUCTURES OF A LOW-VOLTAGE-OPERATIVE NON-VOLATILE FERROELECTRIC MEMORY DEVICE WITH FLOATING GATE

[75] Inventors: Yean-Kuen Fang; Fu-Yuan Chen, both of Tainan; Jiann-Ruey Chen, Hsinchu, all of Taiwan

[73] Assignee: National Science Council, Taipei, Taiwan

[21] Appl. No.: 08/965,406

[22] Filed: Nov. 6, 1997

[51] Int. Cl.$^7$ ..................................................... G11C 11/22
[52] U.S. Cl. ........................................ 365/145; 365/185.26
[58] Field of Search .................................... 365/145, 184, 365/174, 117, 185.26; 257/295

[56] References Cited

U.S. PATENT DOCUMENTS

| | | | |
|---|---|---|---|
| 4,163,985 | 8/1979 | Schuermeyer et al. | 365/184 |
| 5,229,309 | 7/1993 | Kato | 437/43 |
| 5,369,296 | 11/1994 | Kato | 365/145 |

*Primary Examiner*—David Nelms
*Assistant Examiner*—Thong Le
*Attorney, Agent, or Firm*—Jacobson, Price, Holman & Stern, PLLC

[57] ABSTRACT

A non-volatile ferroelectric memory device has been developed, in which the lead titanate ($PbTiO_3$) thin film is deposited on a n/P$^+$ Si substrate by rf magnetron sputtering as the gate oxide and Pt is embedded in the gate oxide as the floating gate. Additionally, associated with the rapid bulk channel structure with higher mobility, the developed memory device has the following features: (1) low write/erase voltage ($\leq 10$ V); (2) fast access time (<160 ns); (3) easy to fabricate on VLSI memory device.

17 Claims, 5 Drawing Sheets

STRUCTURES OF A LOW-VOLTAGE-OPERATIVE NON-VOLATILE FERROELECTRIC MEMORY DEVICE WITH FLOATING GATE

FIELD OF APPLICATIONS

This invention utilizes thin ferroelectric material—lead titanate as the gate oxide, and Pt as the floating gate, combined with highly mobile rapid bulk channel transistor structure to obtain a type of low-voltage operation and fast access non-volatile memory device which may be applied in scientific, commercial and information industries, etc..

CROSS-REFERENCE TO RELATED APPLICATIONS

In today's highly-developed computer industry, the development of memory devices is deemed as one of the most important things. Yet, among current memory devices, although both hard and soft discs have great memory capacity, their read/write speed is not fast enough. David Bondurant, et al, reported in 1989 in IEEE Spectrum, p. 30 regarding a Random Access Memory (RAM) that it can read and write quickly, but data will disappear when the power is turned off. Even though the data in the Read Only Memory (ROM) will not disappear when the power is turned off, it is limited to a read-only function. Although Erasable Programmable Read Only Memory, EPROM, and Electrically Erasable Programmable Read Only Memory, EEPROM, have been modified so that the data will not disappear when the power is turned off, and it can read and write, the writing procedure is not only cumbersome, its number of repeat writing is also not entirely ideal. As a result, the creation of a memory device that has a non-volatile memory function similar to a ROM, and can speedily and easily allow for repeated read/write, has become an important direction for research. In 1991, Charles Kittel, in Introduction to Solid State Physics, Chapter 13, presented the fact that the thin titanate ferroelectric film has high Curie temperature and larger remnant polarization. Utilizing this characteristic, M. Okayama, et al, in the 1985 Ferroelectrics, Volume 63, p. 243, and Y. Matsui in his Doctoral thesis at the Osaka University, p. 82, disclosed the creation of a memory device with surface channel MFS-FET structure which has a non-volatile memory function similar to ROM, and can speedily and easily allow for repeated read/write. However, the high operating voltage for this memory device (larger than 30 volts) is its shortcoming.

SUMMARY OF THE INVENTION

The objective of this invention is to supply a low-voltage-operative, and rapid access, non-volatile memory device which conforms to the manufacturing process for very large-scale integrated circuit (VLSI), thus facilitating future development of a VLSI memory device.

Methods Adopted to Resolve the Issues

To develop a low-voltage-operative, and rapid access, non-volatile memory device, the inventors have, upon intensive research, discovered that in replacing traditional surface channel structure with high mobility bulk channel, faster access speed may be achieved. This may be verified in John P. Uyemura's report published in 1988 on the Fundamentals of MOS Digital Integrated Circuits, Chapter 1, p. 21. In addition, the cause and solution for high operating voltage in the past are also found as follows:

(1) In the past, a traditional surface channel MFS-FET lead titanate ferroelectric memory device has attempted to avoid damaging the Si surface during a $PbTiO_3$ sputtering process by extending a buffer layer, $SiO_2$, on the Si surface to protect it. However, this $SiO_2$ layer will increase the operating voltage. To resolve this problem, we use a bulk channel to replace the surface channel structure, thus exempting the use of the $SiO_2$ buffer layer (because carriers in the channel structure move about far away from the surface).

(2) Remnant polarization of the lead titanate ferroelectric thin film increases with the increasing thickness of the film. It reaches saturation when the thickness is approximately 2 $\mu$m. Films with thickness less than 1 $\mu$m may not be used due to their small remnant polarization. As a result, in order to obtain maximum remnant polarization, the thickness of the film should be increased, yet doing so also increases the operating voltage. In order to resolve this difficulty, we utilize the electric charges stored in the floating gate to store data, rather than the use of traditional remnant polarization to store data. As a result, the thickness of the ferroelectric thin film may be greatly reduced to 550 Å, which is far less than the traditional 2 $\mu$m. Therefore, the operating voltage is further reduced substantially.

BRIEF DESCRIPTION OF THE DRAWINGS

FIG. 5($a$) The floating gate contains negative charges.

FIG. 5($b$) Negative charges in the floating gate being erased; the slash area in the sketch indicates a depletion region.

Reference Number Of The Attached Drawings:

| | |
|---|---|
| 1 | Source |
| 2 | Gate |
| 3 | Drain |
| 4 | $PbTiO_3$ |
| 5 | Pt |
| 6 | Substrate |
| n | N-type epitaxial layer of a n/p$^+$ type silicon wafer |
| P$^+$ | P$^+$ type base layer of a n/p$^+$ type silicon wafer |
| 8V | 8V writing voltage applied to the gate |
| −8V | −8V erasing voltage applied to the gate |
| 10V | 10V writing voltage applied to the gate |
| −10V | −10V erasing voltage applied to the gate. |

DETAILED DESCRIPTION FOR THE INVENTION

This invention pertains to a low-voltage-operative, non-volatile MFS-FET memory device which is equipped with a floating gate; it comprises:

A baseboard in the same material but different type, i.e. it is a silicon baseboard with a p-n welded surface;

A thin ferroelectric film, which is installed above the welded baseboard in the same material but different type, and is used for wrapping the floating gate; that thin ferroelectric film is a lead titanate ferroelectric thin film;

A floating gate made of Pt is placed within the thin ferroelectric film, and is used to store electric charges;

A gold thin film is fixed on the thin ferroelectric film, and used as the gate for the memory device;

An aluminum-based source metallic thin film and a drain metallic thin film are fixed on the baseboard in the same material but different type ; they are placed respectively on both sides of the ferroelectric thin film to form a contact with it;

An aluminum backed substrate metallic thin film is fixed on the other side of the baseboard with the same material but in a different type;

The thin lead titanate ferroelectric film is located below the floating gate with a thickness of 50 Å, while its upper thickness is 500 Å.

This invention also includes a method for producing lead titanate ferroelectric thin film non-volatile memory device. It comprises of: Using rf magnetron sputtering system to form the first layer of lead titanate ferroelectric thin film on a baseboard of the same material but in a different type; a floating gate is deposited on top of the first layer of lead titanate ferroelectric thin film by electron gun evaporation; a rf magnetron sputtering system is used to form the second layer of lead titanate ferroelectric thin film and wraps over the floating gate; a gate metallic thin film is steamed over the second layer of lead titanate ferroelectric thin film; a source metallic thin film and a drain metallic thin film are steamed on that welded baseboard of the same material but in a different type, and placed on the two sides of that ferroelectric thin film respectively to form contact; a substrate metallic thin film is then steamed on the other side of that baseboard of the same material but a different type.

Description of the Various Components

Figure 1:
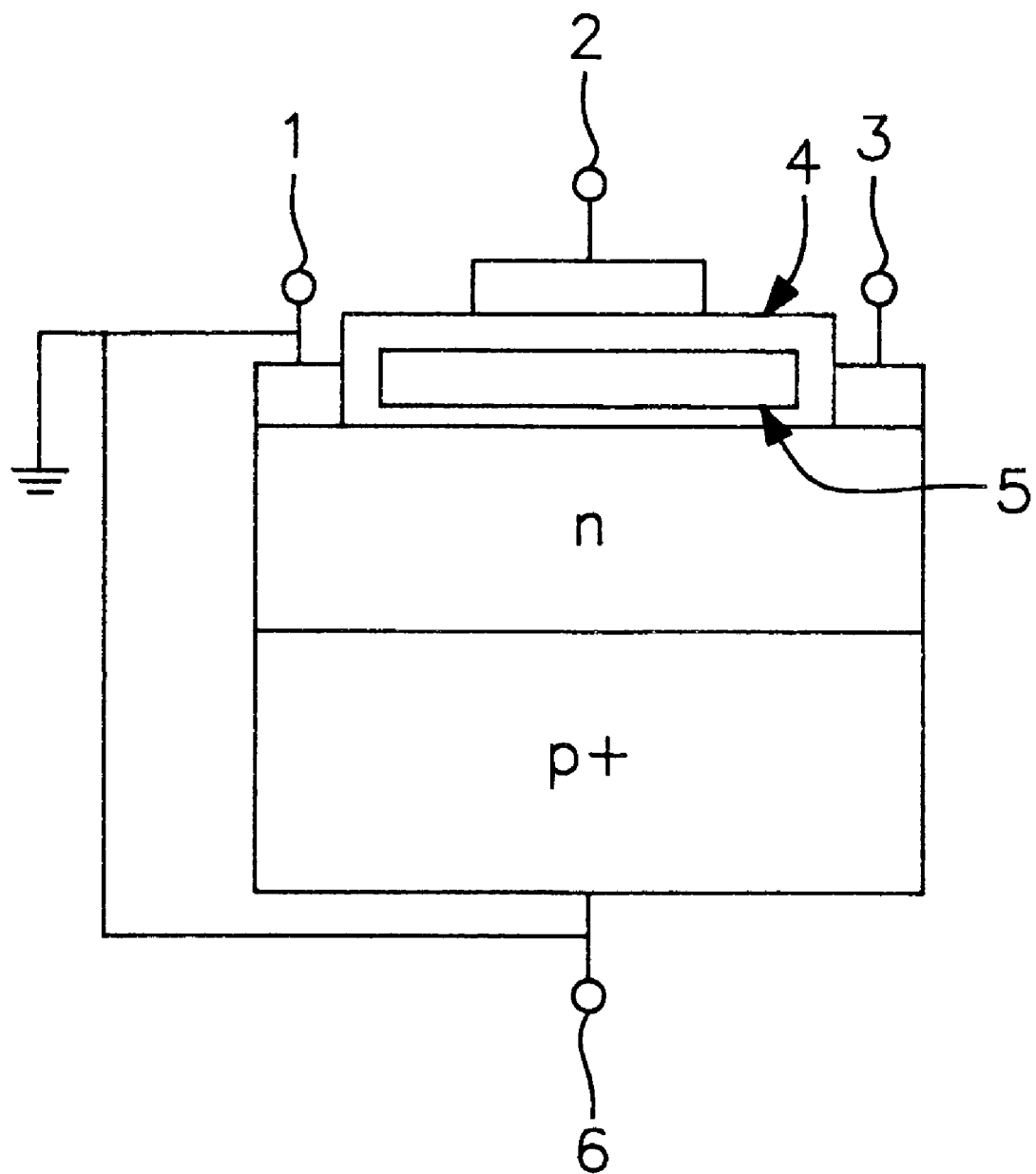
FIG. 1 The Component structure.

This invention also includes a method for producing a lead titanate ferroelectric thin film, non-volatile memory device. The accompanying illustrative description is as follows while the component structure is shown in FIG. 1:

(1) Rinse n/p$^+$ type silicon wafer.

(2) A rf magnetron sputtering system is used to form a 50 Å thick lead titanate ferroelectric thin film on n layer as the first insulating layer.

(3) An electron gun evaporation is used to steam Pt over the first insulating layer as the floating gate.

(4) A rf magnetron sputtering system is used to form a 500 Å thick lead titanate ferroelectric thin film as the second insulating layer and also covers the gate —Pt— under it.

(5) The photolithography and evaporation technique are used to steam a gold gate over the lead titanate ferroelectric thin film, and then the photolithography technique is used to etch the lead titanate in order to open the source and the drain windows.

(6) Evaporation and lift-off technique are used to steam the source electrode and the drain electrode.

(7) The back of the silicon baseboard is steamed with the aluminum electrode.

The said rf magnetron sputtering system's target diameter is 5 cm, and the distance from the target to the sample is 5 cm, with the sputtering power of 100W, the sputtering gas is Ar (90%)+O$_2$ (10%), the growth pressure is 6 mtorr, while the baseboard's temperature is 500~600° C.

Figure 2:
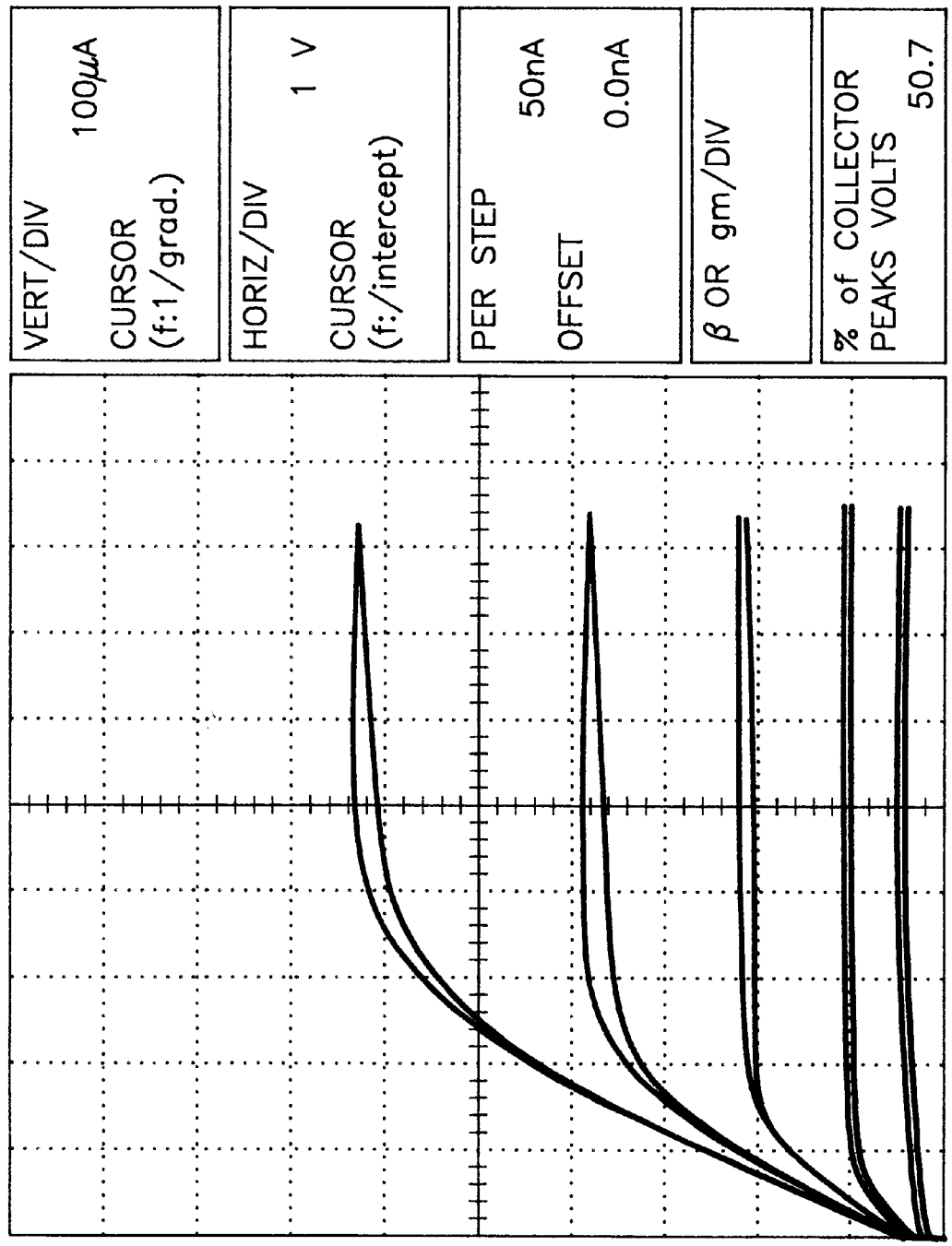
FIG. 2 typical drain current/drain voltage curve obtained a few minutes after the gate pulse voltage of a 200 $\mu$s width is applied; from top to the bottom are 0 volt, 4 volts, 6 volts, 8 volts and 10 volts respectively.
Figure 3:
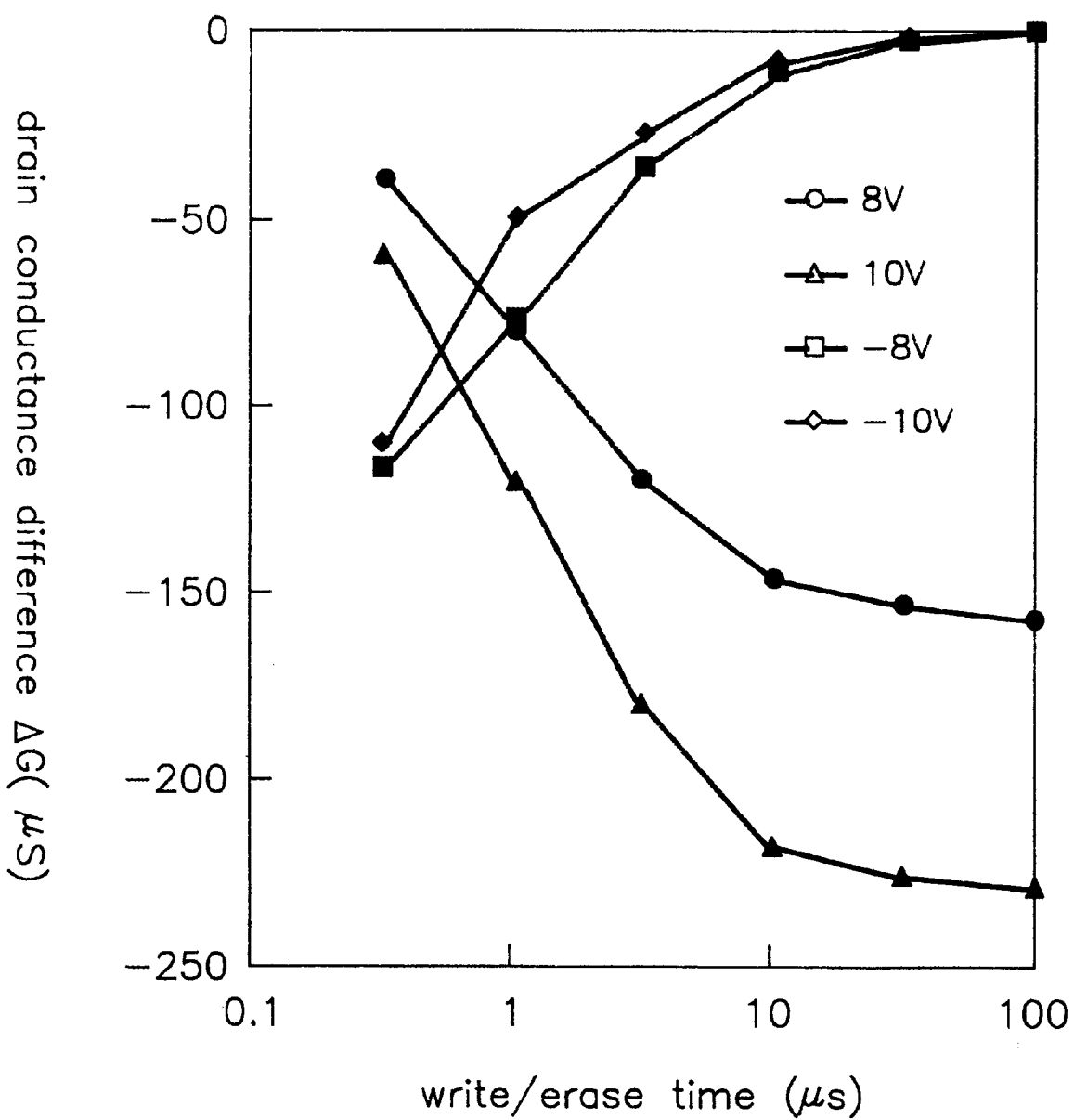
FIG. 3 The effects of write/erase time on the drain conductance difference $\Delta G$ with write/erase voltage (applied gate voltage) as a parameter.
Figure 4:
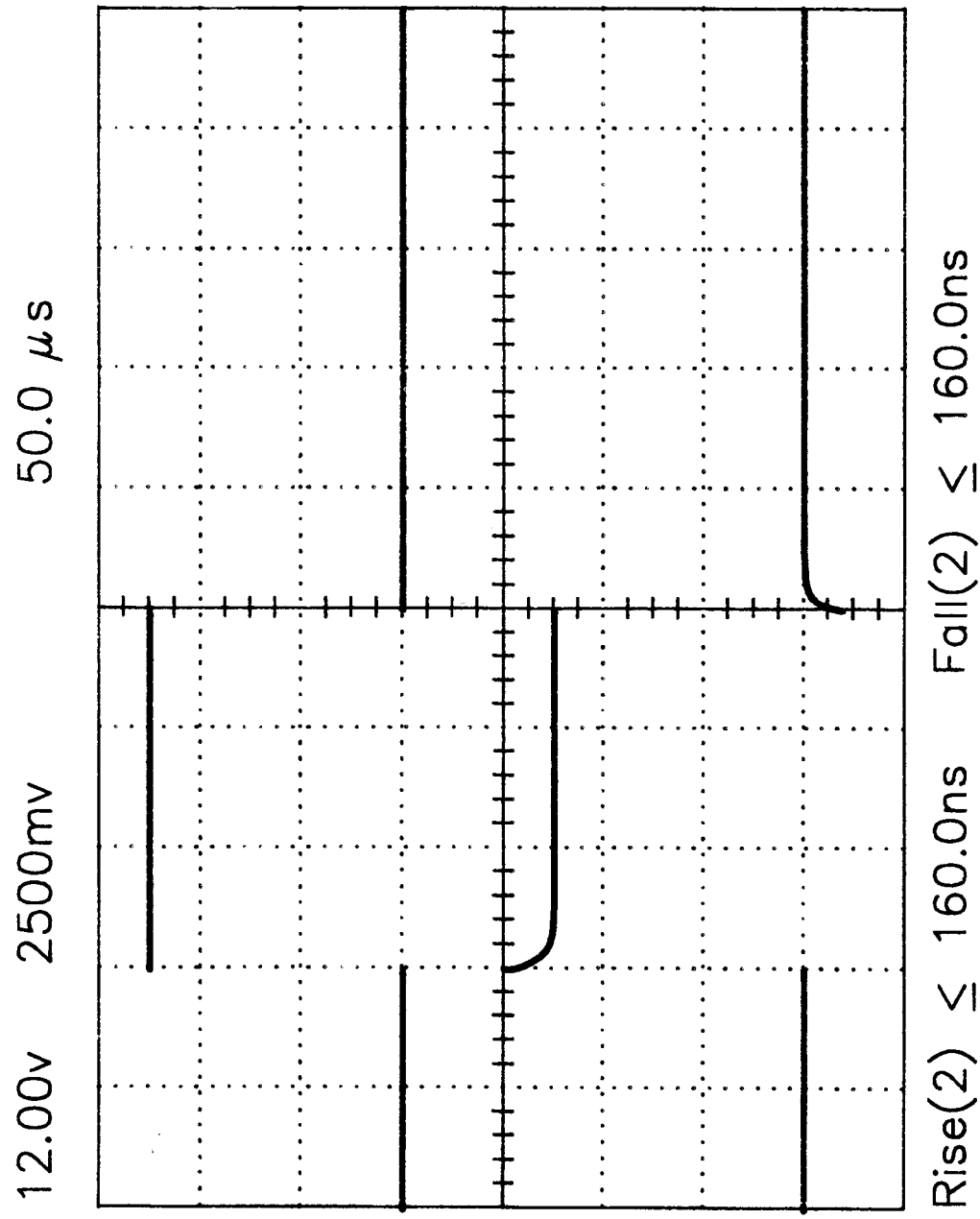
FIG. 4 Reading time response characteristics under the on state obtained via HP 54600Amodel oscilloscope; the upper curve is the voltage pulse applied to the drain terminal, while the lower curve is the drain current measured from the load.

Testing of Component's Characteristics:

This invention uses Hp 370A curve tracer to measure its current/voltage curve, and uses Hp 54600A model oscilloscope to measure its access time. FIG. 2 is a typical drain current/drain voltage graph obtained several minutes after 200 $\mu$s wide pulse voltage is applied on the gate; from top to bottom are 0 volt, 4 volts, 6 volts, 8 volts and 10 volts respectively. FIG. 3 is the impact to drain conductance with different write/erase voltages applied to the gate under different write/erase time. FIGS. 2 and 3 indicate the way drain conductance decreases as writing voltage and time increase, and increases as erasing voltage and time increase. FIG. 4 is the access time's corresponding oscillating curves detected by Hp 54600A model oscilloscope; the upper curve is the voltage pulse applied to the drain, while the lower curve is the drain current measured via the load, it indicates a rapid access time (less than 160 ms). In addition, we apply a 10 volt sinusoidal wave on the gate to observe the decline of the drain conductance in order to measure its fatigue effect. It is found that until the write/erase cycles reach $10^6$, no sign of fatigue or decline occurred. Furthermore, $10^5$ seconds after programming the data (which means $10^5$ seconds after the completion in application of the positive gate pulse voltage), the drain conductance merely changed by 0.01 $\mu$s.

Functions of this Invention

The non-volatile ferroelectric memory device produced in this invention has the following functions:

(1) As the lead titanate thin film's thickness is merely 550 Å, which is far smaller than traditional 2 $\mu$m, it does not require a SiO$_2$ buffer layer. Therefore, when compared with traditional 30 volt write/erase voltage, it has low write/erase voltage (smaller than 10 volts).

(2) Due to the use of bulk channel with high mobility, it has rapid access time(less than 160 ms) when compared with traditional access time of 200 ns.

(3) It can easily be made into a VLSI memory device.

EXAMPLES OF ACTUAL IMPLEMENTATION

Figure 5A:
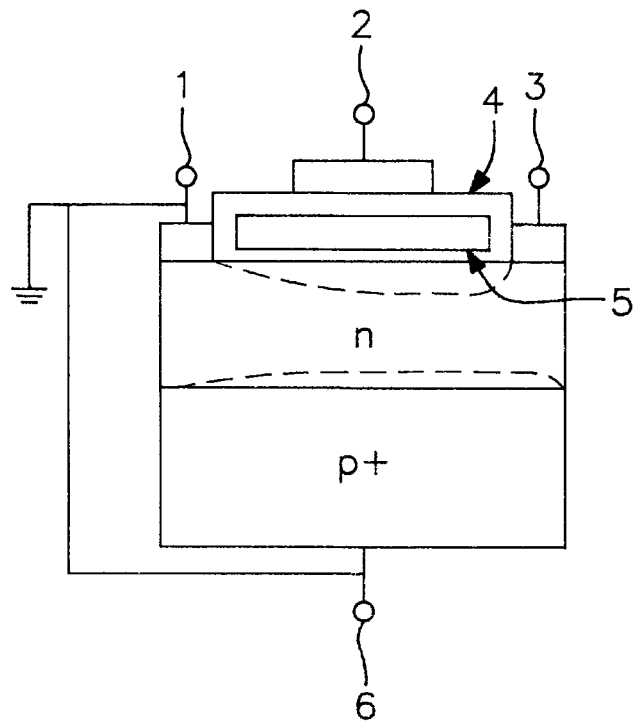
FIGS. 5($a$)–5($b$) A section viewed sketch of the floating gate MFS-FET.
Figure 5B:
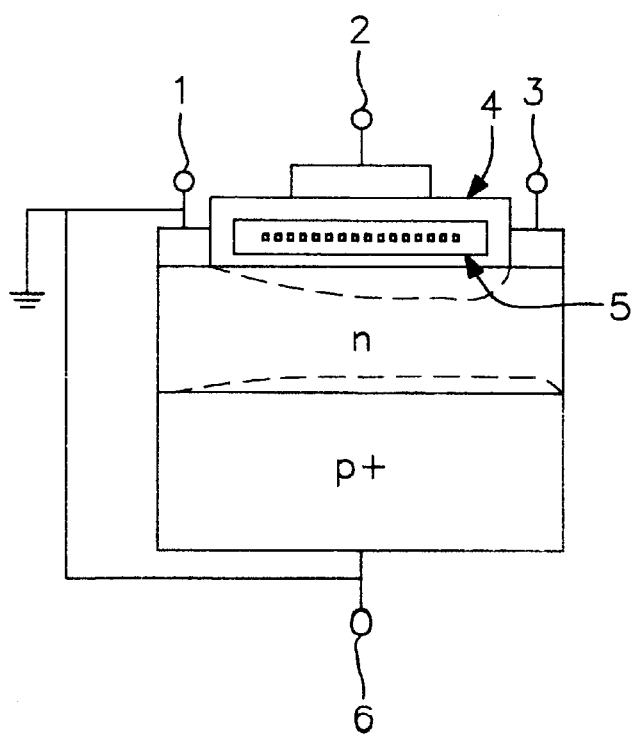

Examples of actual implementation will be used to further explain in detail this invention. When the positive voltage (write) is applied to the gate, the electrons in the n layer will be attracted to tunnel through the first insulating layer and enter the floating gate. After the completion of voltage application, the negative electric charges stored in the floating gate will repel the electrons on the surface of the n layer, forming a larger surface depletion region. Then, the n channel becomes narrow and the drain conductance becomes smaller, as shown in FIG. 5(a). When the negative voltage (erase) is applied to the gate, the original electrons stored in the floating gate will be repelled and reduced. Upon the completion of negative voltage application, as the negative electric charges in the floating gate reduce, the electrons in the n layer will move toward the surface. Thus, the surface depletion region is reduced, the n channel is widen and the drain conductance is enlarged, as shown in FIG. 5(b).

We claim:

1. A non-volatile memory device with a baseboard structure which contains a metallic floating gate/ferroelectric thin film/same material but different type welded surface; it consists of:

a baseboard in the same material but different type,;

the baseboard being a silicon baseboard with a p-n welded surface;

a thin ferroelectric film which is fixed on the welded surface base, and wraps the floating gate;

a floating gate made of Pt is embedded in the thin ferroelectric film, and used to store electric charges;

a metallic thin film is fixed on the thin ferroelectric film, and provides the gate for the memory device;

an aluminum-based source metallic thin film and a drain metallic thin film, which are fixed on the baseboard and placed on the two sides of the ferroelectric thin film respectively to form contact with it; and an aluminum substrate metallic thin film, which is fixed on the other side of the baseboard;

wherein the gate metallic thin film is made of gold.

2. The non-volatile memory device with metallic/ferroelectric thin film/same material but different type welded baseboard structure claimed as claim 1, where the same material but different type welded baseboard is a n/p$^+$ type silicon baseboard.

3. The non-volatile memory device with metallic/ferroelectric thin film/same material but different type welded baseboard structure claimed as claim 1, where the same material but different type welded baseboard is a p/n$^+$ type silicon baseboard.

4. The non-volatile memory device with metallic/ferroelectric thin film/same material but different type welded baseboard structure claimed as claim 1, where the ferroelectric thin film is a lead titanate ferroelectric thin film.

5. The non-volatile memory device in metallic/ferroelectric thin film/same material but different type welded baseboard structure claimed in claim 1, where lead titanate ferroelectric thin film is located below the floating gate with a thickness as 50 Å and its upper thickness is 500 Å.

6. The non-volatile memory device with metallic/ferroelectric thin film/same material but different type welded baseboard structure claimed as claim 1, where the source metallic thin film is made of aluminum.

7. The non-volatile memory device with metallic/ferroelectric thin film/same material but different type welded baseboard structure claimed as claim 1, where the drain metallic thin film is made of aluminum.

8. The non-volatile memory device with metallic/ferroelectric thin film/same material but different type welded baseboard structure claimed as claim 1, where the substrate metallic thin film is made of aluminum.

9. A method for producing a lead titanate ferroelectric thin film non-volatile memory device, the method including:

using a rf magnetron sputtering system to form a first layer of lead titanate ferroelectric thin film on a baseboard of a same material but a different type;

using electron gun evaporation to steam a floating gate on top of the first layer of lead titanate ferroelectric thin film;

using the rf magnetron sputtering system to form a second layer of lead titanate ferroelectric thin film which wraps the floating gate;

steaming a gate metallic thin film over the second layer of lead titanate ferroelectric thin film, and then steaming a source metallic and a drain metallic thin film on the baseboard so that they are placed respectively on both sides of the lead titanate ferroelectric thin film to form a contact with it; and steaming a substrate metallic thin film on the other side of that baseboard.

10. The method in producing lead titanate ferroelectric thin film non-volatile memory device claimed as claim 9, where the rf magnetron sputtering system's target diameter is 5 cm, while the distance from the target to the sample is 5 cm, with the sputtering power of 100W, the sputtering gas is Ar (90%)+$O_2$ (10%), the growth pressure is 6 mtorr, and the baseboard's temperature is 500~600° C.

11. The method in producing lead titanate ferroelectric thin film non-volatile memory device claimed as claim 9, where the floating gate is made of Pt.

12. The method in producing lead titanate ferroelectric thin film non-volatile memory device claimed as claim 9, where the gate metallic thin film is made of gold.

13. The method in producing lead titanate ferroelectric thin film non-volatile memory device claimed as claim 9, where the source metallic thin film is made of aluminum.

14. The method in producing lead titanate ferroelectric thin film non-volatile memory device claimed as claim 9, where the drain metallic thin film is made of aluminum.

15. The method in producing lead titanate ferroelectric thin film non-volatile memory device claimed as claim 9, where the substrate metallic thin film is made of aluminum.

16. The method in producing lead titanate ferroelectric thin film non-volatile memory device claimed as claim 9, where the same material but different type, welded baseboard is made of a n/p$^+$ type of silicon wafer.

17. The method in producing lead titanate ferroelectric thin film non-volatile memory device claimed as claim 9, where the same material but different type, welded baseboard is made of a p/n$^+$ type of silicon wafer.

* * * * *